United States Patent [19]

Fujikawa et al.

[11] Patent Number: 4,481,280
[45] Date of Patent: Nov. 6, 1984

[54] PHOTOSENSITIVE POLYAMIDE RESIN COMPOSITION

[75] Inventors: Junichi Fujikawa, Kyoto; Masaharu Taniguchi, Shiga, both of Japan

[73] Assignee: Toray Industries, Inc., Tokyo, Japan

[21] Appl. No.: 464,652

[22] Filed: Feb. 7, 1983

Related U.S. Application Data

[63] Continuation of Ser. No. 242,307, Mar. 10, 1981, abandoned.

[30] Foreign Application Priority Data

Mar. 13, 1980 [JP] Japan .................................. 55/32044

[51] Int. Cl.³ .................................................. G03C 1/68
[52] U.S. Cl. ................................ 430/281; 204/159.15; 204/159.19; 204/159.22; 430/280; 430/283; 430/288
[58] Field of Search ............... 430/280, 281, 283, 288; 204/159.15, 159.19, 159.22

[56] References Cited

U.S. PATENT DOCUMENTS 4,170,481 10/1979 Akama et al. .................... 430/281
4,230,790 10/1980 Hill .................................. 430/281
4,267,258  5/1981 Yoneda et al. .................... 430/281

FOREIGN PATENT DOCUMENTS 45-14540 4/1974 Japan .

Primary Examiner—Jack P. Brammer
Attorney, Agent, or Firm—Austin R. Miller

[57] ABSTRACT

A photosensitive polyamide resin composition is provided which comprises:
(A) 100 wt. parts of an alcohol-soluble polyamide,
(B) 0.1-50 wt. parts of a compound having both vinyl and epoxy groups in the same and one molecule, and
(C) 10-200 wt. parts of a polyfunctional vinyl monomer having a molecular weight of lower than 2,000 and at least two linkages represented by the following formula:

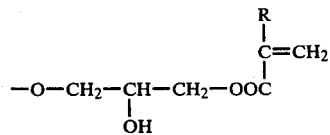

wherein R stands for H or CH₃. This composition results in a photosensitive relief plate excellent in the image-reproducing property and softness and elasticity characteristics.

9 Claims, No Drawings

PHOTOSENSITIVE POLYAMIDE RESIN COMPOSITION

This is a continuation of application Ser. No. 242,307, filed Mar. 10, 1981, now abandoned.

BACKGROUND OF THE INVENTION

1. Field of the Invention

This invention relates to a novel photosensitive polyamide resin composition. More particularly, it relates to a polyamide resin composition for use as a relief printing material having high image-reproducing properties and exhibiting good softness and elasticity.

2. Description of the Prior Art

As the process for preparing a photosensitive polyamide resin composition having high image-reproducing properties, there has been proposed a process in which a polyamide is reacted with a compound having one vinyl group and one epoxy group to obtain a photosensitive resin consisting of a polyamide having double bonds introduced therein by this reaction (see Japanese Patent Publications No. 16,062/72, No. 45,583/72 and No. 23,304/74).

The sensitivity of a photosensitive resin comprised solely of a polyamide having double bonds is low because the mobility of the polyamide is low, and therefore, to obtain high image-reproducing properties, the exposure time to actinic rays must be prolonged considerably. Furthermore, this resin is defective in that the wash-out speed is very slow in the non-illuminated non-image area. As means for eliminating these defects, there have been proposed processes in which a monofunctional vinyl monomer is incorporated as a photo-insolubilizer into a polyamide having double bonds introduced therein (see Japanese Patent Publication No. 45,585/72 and No. 13,442/74 and Japanese Laid-Open Patent Application No. 40,349/74). For example, Japanese Patent Publication No. 45,585/72 teaches that a monofunctional vinyl monomer having a terminal hydroxyl group, such as hydroxyalkyl acrylate or methacrylate, is used as the photo-insolubilizer. However, since the crosslinked structure formed by photo-polymerization in this system is made of the monofunctional vinyl monomer and the polyamide having double bonds introduced therein, the crosslinked structure is not three-dimensional and the structure has poor resistance to developer solvent. Accordingly, the problem of dissolving-out and the collapse of dots during development arises, with the collapse of the relief image being especially conspicuous when the development time is prolonged. As means for eliminating these defects, there is known a composition in which a polyfunctional vinyl monomer is incorporated as the photo-insolubilizer as proposed in Japanese Patent Publication No. 13,442/74 and Japanese Laid-Open Patent Application No. 40,349/74. However, since ordinary polyfunctional vinyl monomers of the polyether, polyester or bisacrylamide type disclosed in Japanese Laid-Open Patent Application No. 40,349/74 have poor compatibility with polyamides, the polyfunctional vinyl monomers tend to separate and appear on the surface of the photosensitive layer during storage tests. Accordingly, this composition cannot be used as a photosensitive resin relief material where a long-term guarantee of quality is required.

Japanese Patent Publication No. 13,442/74 proposed use of a polyfunctional vinyl monomer obtained by reacting at least one member selected from unsaturated carboxylic acids, unsaturated alcohols, primary amines and secondary amines with glycidyl arcylate or methacrylate, which is represented by the following general formula:

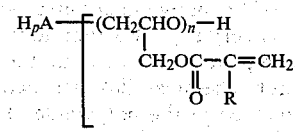

wherein p and m are numbers satisfying requirements of $p+m=k$ and $1 \leq m \leq k$, n is a number of from 1 to 10, R stands for H or an alkyl group, and A stands for a residue derived from an unsaturated carboxylic acid, an unsaturated alcohol, a primary amine or a secondary amine.

The above-mentioned polyfunctional vinyl monomer is superior to the ordinary polyfunctional vinyl monomers proposed in Japanese Laid-Open Patent Application No. 40,349/74 in compatibility with polyamides. It is believed that this is due to the —OH group formed by the reaction of the active hydrogen atom of the unsaturated carboxylic acid, unsaturated alcohol, primary amine or secondary amine with the epoxy group of glycidyl acrylate or methacrylate. However, since the unsaturated carboxylic acid, unsaturated alcohol or secondary amine has only one active hydrogen atom, only one molecule of glycidyl acrylate or methacrylate is added to such active hydrogen-containing compound and the formed polyfunctional vinyl monomer contains only one —OH group in the molecule. Accordingly, this polyfunctional vinyl monomer is still not sufficiently compatible with polyamides. Where the resulting composition is subjected to an accelerated storage test at a high relative humidity exceeding 80% or a high temperature of 35° to 40° C., the polyfunctional vinyl monomer still tends to separate from the polyamides. Furthermore, if a relief material formed of this composition is stored in a room for a long time in summer, the polyfunctional vinyl monomer appears on the surface of a relief material. When the primary amine is reacted with glycidyl acrylate or methacrylate two hydroxyl groups are formed, since the primary amine has two active hydrogen atoms in the molecule. This improved the compatibility with polyamides and the polyfunctional vinyl monomer does not separate even during an accelerated storage test conducted under high humidity and high temperature conditions. When a primary amine is used, double bonds are combined through linkages as shown by the following formula:

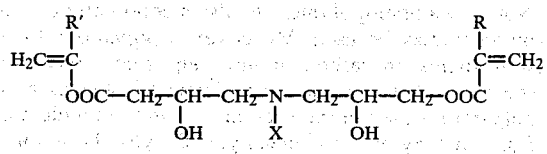

wherein R and R' each stand for H or CH₃, and X stands for a residue of the primary amine.

As is apparent from the above formula, two molecules of glycidyl acrylate or methacrylate are combined with one nitrogen atom. The molecular weight between the two double bonds is lowest, a value of 272, when two molecules of glycidyl acrylate are added, and is highest, a value of 300, when two molecules of glycidyl methacrylate are added. Since the molecular weight between the two double bonds is relatively low, i.e. in the range of from 272 to 300, and only chemical linkages which are relatively rigid, such as ester linkages or epoxy ester linkages, are present between the two double bonds, the crosslinked structure formed by photopolymerization of the above-mentioned polyfunctional vinyl monomer is very rigid. Furthermore, the polyamide chain is completely included in the crosslinked structure through chemical linkages because double bonds are introduced in the polyamide. Therefore, an exposed relief plate using such composition is very hard and brittle. With a hard and brittle relief plate, serious problems, such as separation of the plate from the relief drum and cracking of the relief, occur during the printing operation.

SUMMARY OF THE INVENTION

A primary object of the present invention is to provide a photosensitive polyamide resin composition which contains a polyfunctional vinyl monomer having good compatibility with a polyamide having double bonds introduced therein and is capable of providing a photosensitive relief plate with excellent image-reproducing properties and with the softness and elasticity characteristics desired.

Other objects and advantages of the present invention will be apparent from the following description.

In accordance with the present invention, there is provided a photosensitive polyamide resin composition comprising the following components:

(A) 100 parts by weight of an alcohol-soluble polyamide, (B) 0.1 to 50 parts by weight of a compound having both vinyl and epoxy groups in the same molecule, and (C) 10 to 200 parts by weight of a polyfunctional vinyl monomer having a molecular weight of less than 2,000 and at least two linkages represented by the following formula:

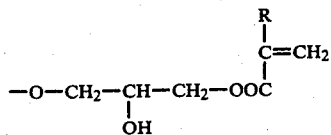

wherein R stands for H or CH$_3$.

The respective components will now be described in detail.

The alcohol-soluble polyamide, i.e., the component (A), is a linear polyamide prepared from a dibasic fatty acid and a diamine, an ω-amino acid or a lactam, or from derivatives thereof, according to a known method. Not only a homopolymer but also a copolymer or block polymer may be used. Moreover, a polyamide having substituents on carbon or nitrogen atoms constituting the main chain can be used. Typical instances of the polyamides used in the present invention include nylon 3, nylon 4, nylon 5, nylon 6, nylon 8, nylon 11, nylon 12, nylon 13, nylon 6-6, nylon 6-10, nylon 13-13, a polyamide derived from metaxylylene diamine and adipic acid, a polyamide derived from trimethylhexamethylene diamine, an isophorone diamine and adipic acid, an ε-caprolactam/adipic acid/hexamethylene diamine/4,4'-diaminodicyclohyxylmethane copolyamide, an ε-caprolactam/adipic acid/hexamethylene diamine/polyethylene glycol diamine copolyamide, a polyamide having a basic tertiary nitrogen atom, such as an N,N-di(γ-aminopropyl) piperazine adipate/ε-caprolactam copolymer, and a polyamide having incorporated therein a quaternizing agent capable of forming an ammonium ion, such as acrylic acid, and an N-alkoxyalkyli-substituted polyamide, such as an N-methoxymethyl-substituted nylon 6, and an N-ethoxyethyl-substituted nylon 66. These polyamides may be used alone or in combination.

As the compound having both vinyl and epoxy groups in the molecule, i.e., component (B), examples would include but are not limited to, glycidyl acrylate, glycidyl methacrylate, glycidyl α-chloroacrylate and N-glycidylacrylamide. Furthermore, there may be used unsaturated compounds obtained by reacting one epoxy group of an ordinary epoxy resin (diepoxide) with a compound having a group capable of reacting with an epoxy group, such as a vinyl group-containing carboxylic acid, amine or alcohol.

This compound having vinyl and epoxy groups in the molecule is used as one component of the photo-insolubilizer, but part of this compound readily reacts with the terminal amine linkage of the polyamide in the step of mixing with polyamide solution or the subsequent deaerting and aging steps whereby a double bond is introduced into the polyamide. This can be confirmed quantitatively because the quantity of the terminal amine of the polyamide is decreased promptly and with the lapse of time at the mixing and aging steps after such a compound is added to a polyamide solution. Also, the quantity of the carboxyl groups located at the terminal opposite to the terminal amine is decreased with the lapse of time, though the rate of decrease is lower than that of the terminal amine. Accordingly, there may be a possibility of introducing of double bonds by a reaction of the terminal carboxylic group with the epoxy group. In order to accelerate the reaction of terminals of the polyamide with the epoxy groups, it is preferred that the epoxy group-containing vinyl monomer as the component (B) be incorporated with the polyamide, prior to the addition of the other photo-crosslinking component, and that the reaction temperature be elevated or a catalyst for opening the epoxy ring, such as triethylbenzyl ammonium chloride, be added together with the epoxy group-containing monomer. However, even without the adoption of such special means, it is possible to readily introduce into the polyamide molecule a certain quantity of double bonds during the step of mixing the epoxy group-containing vinyl monomer with the polyamide solution maintained at a temperature of 60° to 80° C., and during step of deaerating and aging the mixed solution. It is presumed that reaction of the epoxy group with an active carbon atom of an alcohol or water as the solvent for the polyamide takes place simultaneously with the reaction of the epoxy group-containing vinyl monomer with the terminals of the polyamide, and thus, the epoxy group-containing vinyl monomer as the component (B) is converted with the lapse of time to an alcohol- or water-added vinyl monomer. This is confirmed by the determination of the residual amount of the epoxy group. Such alcohol- and water-added vinyl monomers formed as by-products reduce the compactness of the crosslinked structure formed by irradiation with actinic rays or reduce the rate of polymerization, resulting in degradation of the image-reproducing properties. Accordingly, if the component (B) is incorporated in large quantity, the adverse effect of such vinyl monomers formed as the by-products cannot be ignored. If the amount of the component (B) exceeds 50 parts by weight per 100 parts by weight of the polyamide, the adverse action of such alcohol- and water-added vinyl monomers become pronounced. Therefore, the upper permissible limit of component (B) is 50 parts by weight per 100 parts by weight of the polyamide. If the amount of component (B) is too small, the quantity of double bonds introduced into the polyamide becomes insufficient and the effect of improving the image-reproducing properties is very minor. However, even where the component (B) is incorporated in such a minute amount as about 0.1 part by weight per 100 parts by weight of the polyamide, a substantial improvement in the image-reproducing properties can be attained and the image-reproducing properties are significantly improved as compared with the image-reproducing properties obtained where the component (B) is not added at all. Accordingly, the compound having vinyl and epoxy groups in the molecule as the component (B) is incorporated in an amount of 0.1 to 50 parts by weight, preferably 1 to 20 parts by weight, per 100 parts by weight of the polyamide.

The polyfunctional vinyl monomer having a molecular weight of less than 2,000 and at least two linkages represented by the following formula:

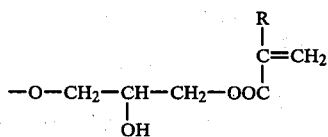

wherein R stands for H or CH₃, used as the component (C) in the present invention, can be prepared by an addition reaction between a polyvalent glycidyl ether and acrylic acid or methacrylic acid, which is represented by the following reaction formula:

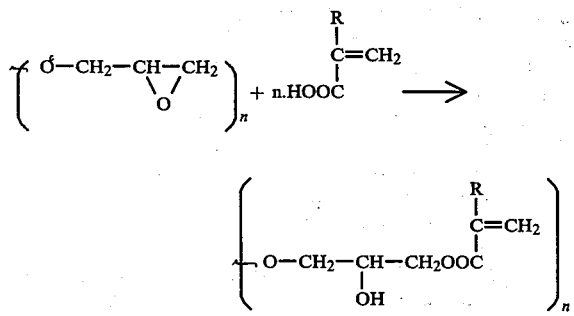

in which R is H or CH₃ and n is an integer of at least 2.

Furthermore, a compound having a similar structure can be prepared by an addition reaction between a saturated polyhydric alcohol and glycidyl acrylate or methacrylate, which reaction is represented by the following formula:

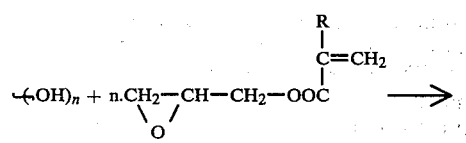

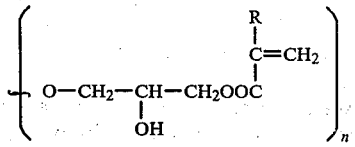

in which R is H or CH₃ and n is an integer of at least 2.

To advance the reaction quantitatively, the addition reaction between a polyvalent glycidyl ether and acrylic acid or methacrylic acid is preferred.

As the glycidyl ether used for the preparation of the polyfunctional vinyl monomer, there can be used, for example, ethylene glycol diglycidyl ether, propylene glycol diglycidyl ether, diethylene glycol diglycidyl ether, triethylene glycol diglycidyl ether, butane diol diglycidyl ether, trimethylolpropane triglycidyl ether and pentaerythritol tetraglycidyl ether.

As the saturated polyhydric alcohol to be reacted with glycidyl acrylate or methacrylate, ethylene glycol, diethylene glycol, triethylene glycol, propylene glycol, butane diol, glycerin, trimethylolpropane and pentaerythritol.

Since the polyfunctional vinyl monomer, i.e., the above-mentioned component (C), has at least two —OH groups in the molecule, this monomer has a very good compatibility with the polyamide, and when an accelerated storage test is carried out under severe conditions, such as relative humidity higher than 80% or temperature higher than 35° C., the separation of polyfunctional vinyl monomer onto the surface of a photosensitive layer does not occur. Where the molecular weight exceeds 2,000, even if the polyfunctional vinyl monomer has at least two —OH groups in the molecule, compatibility with the polyamide is relatively low and the separation of the polyfunctional vinyl monomer onto the surface of the photosensitive layer occurs in the accelerated storage test. Therefore, the molecular weight of the polyfunctional vinyl monomer should be lower than 2,000. Furthermore, the polyfunctional monomer i.e., the component (C), serves to provide a relief material which is soft and elastic even after exposure to actinic rays. It is believed that this effect is due to the fact that an ether linkage (—O—) imparting softness and elasticity is introduced into the molecule chain containing double bonds. The number of the ether linkages present in the polyfunctional vinyl monomer is the same as that of the double bonds. Since, in an ether linkage the rotary movement around the molecule chain is more readily effected, it is believed that this polyfunctional vinyl monomer provides a much softer crosslinked structure after photo-polymerization than a polyfunctional monomer comprised solely of ester linkages. Moreover, if a polyvalent glycidyl ether or polyhydric alcohol having a long molecule chain is used in the preparation of the polyfunctional vinyl monomer, the molecule chain between the two double bonds becomes long and the resulting crosslinked structure becomes soft and elastic. However, if the molecular weight exceeds 2,000, the distance between two double bonds is too long, and the compactness of the crosslinked structure is reduced and the image-reproducing properties are also reduced. Thus, the molecular weight of the polyfunctional vinyl monomer should be less than 2,000.

The polyfunctional vinyl monomer, component (C), prepared by an addition reaction between a polyvalent glycidyl ether and acrylic acid or methacrylic acid or by an addition reaction between a saturated polyhydric alcohol and glycidyl acrylate or methacrylate, is an excellent photo-crosslinking component which is satisfactory in both compatibility with the polyamide and in producing the desired softness of the resulting printing plate after exposure to actinic rays.

The amount of polyfunctional vinyl monomer used may be varied depending upon the properties required for the resulting relief material. If the amount of the polyfunctional vinyl monomer is smaller than 10 parts by weight per 100 parts by weight of the polyamide, the curing properties are poor and irradiation with actinic rays must be conducted for an extended time. In contrast, if the polyfunctional vinyl monomer is incorporated in an amount larger than 200 parts by weight per 100 parts by weight of the polyamide, the crosslinking density becomes too high and the resulting plate becomes brittle. Therefore, the polyfunctional vinyl monomer should be incorporated in an amount of at least 10 parts by weight but not exceeding 200 parts by weight per 100 parts by weight of the polyamide. The preferred amount of the polyfunctional vinyl monomer is from 20 to 150 parts by weight per 100 parts by weight of the polyamide.

In the composition of the present invention, a polyfunctional vinyl monomer other than the above-mentioned component (C) may optionally be used in combination with the component (C), in an amount of up to 100 parts by weight per 100 parts by weight of the polyamide component (A), to adjust the hardness of the resulting printing plate. However, such a subsidiary polyfunctional vinyl monomer should also be compatible with the polyamide. For this purpose, preferred components would be an addition reaction product of an unsaturated alcohol with glycidyl acrylate or methacrylate, an addition reaction product of an unsaturated carboxylic acid with glycidyl acrylate or methacrylate, an addition reaction product of a primary amine or secondary amine with glycidyl acrylate or methacrylate, and hydroxyl group-containing polyfunctional vinyl monomers, such as pentaerythritol acrylate, pentaerythritol methacrylate, trimethylolpropane diacrylate and trimethylolpropane dimethacrylate.

When an extraordinarily high softness is required for the resulting printing plate, a monofunctional vinyl monomer may be used in combination with the component (C) and other subsidiary polyfunctional vinyl monomers in an amount of up to 100 parts by weight per 100 parts by weight of the polyamide component (A). This monofunctional vinyl monomer should also be compatible with the polyamide. As such monofunctional vinyl monomers, there can be used, for example, hydroxyl group-containing mono-functional vinyl monomers, such as 2-hydroxyethyl acrylate, 2-hydroxyethyl methacrylate, 2-hydroxypropyl acrylate, 2-hydroxypropyl methacrylate, 3-chloro-2-hydroxypropyl acrylate, 3-chloro-2-hydroxypropyl methacrylate, acryloyloxyethyl hydrogenphthalate, methacryloyloxyethyl hydrogenphthalate, β-hydroxyethyl-β-acryloyloxyethyl phthalate, β-hydroxyethyl-β-methacryloyloxyethyl phthalate, 2-hydroxy-3-phenoxypropyl acrylate and 2-hydroxy-3-phenoxypropyl methacrylate; carboxyl group-containing monofunctional vinyl monomers, such as succinoyloxyethyl acrylate and succinoyloxyethyl methacrylate; and acryamides, such as acrylamide and methacrylamide.

In the present invention, it is possible to further increase the softness of the exposed printing plate or to improve the wash-out rate in the non-image area by incorporating in the printing plate up to 100 parts by weight, per 100 parts by weight of the polyamide component (A), of an organic compound not polymerizable by irradiation with actinic rays. Since it is required that such unpolymerizable organic compounds do not volatilize at the drying step, the organic compound should be non-volatile or should have a very low volatility. Furthermore, the organic compound should exhibit good compatibility with the polyamide so that the unpolymerizable organic compound does not separate onto the surface of the photosensitive layer. Accordingly, it is necessary to use an unpolymerizable organic compound having good compatibility with the polyamide. As the unpolymerizable component, there can be used, for example, polyhydric alcohols, such as ethylene glycol, diethylene glycol, triethylene glycol, 1,4-butane diol and glycerin; sulfonamides, such as N-butylbenzene sulfonamide, N-butyltoluene sulfonamide and N-ethyltoluene sulfonamide; alkanolamines, such as diethanolamine and triethanolamine; and nylon-forming starting compounds, such as ε-caprolactam and adipic acid. Ordinarily, if such unpolymerizable substances are left in a large amount in a convention 1 polyamide composition, the image-reproducing properties are often reduced a significant degree. When a polyamide having double bonds introduced therein is used, even where the unpolymerizable substances are left in such an amount as about 50 parts by weight per 100 parts by weight of the polyamide, no substantial reduction of the image-reproducing properties occur.

As the photo-sensitizer used for accelerating the photo-crosslinking reaction in the composition of the present invention, all of the known photo-sensitizer compounds may be used. For example, benzoins, benzophenones, anthraquinones, benzyls and diacetyls may be used. It is preferable that the photo-sensitizer be used in an amount of 0.01 to 10% by weight based on the total weight of the composition.

All of the known thermal polymerization inhibitors can be used for increasing the storage stability of the composition of the present invention. As a preferred inhibitors, there can be mentioned phenols, hydroquinones and catechols. It is preferable that the inhibitor be used in an amount of 0.001 to 5% by weight based on the total weight of the composition.

The composition of the present invention is ordinarily prepared by the following procedure. First, a polyamide, component (A), is dissolved by heating in an alcohol type solvent, and a compound having epoxy and vinyl groups in the molecule, component (B), is added to the polyamide solution. The mixture is maintained at a temperature of from 60° to 80° C. for 30 minutes to two hours whereby the epoxy and vinyl group-containing compound is reacted with the polyamide. Thereafter, a polyfunctional vinyl monomer, component (C), other optional photo-crosslinking agents, a photo-sensitizer, a thermal polymerization inhibitor and other optional additives are added to the mixture, followed by stirring and blending the mixture with heating. The compound having epoxy and vinyl groups, component (B), is reacted with the terminals of the polyamide not only during the mixing step but also with the lapse of time in the subsequent deaerating and aging steps, and double bonds are introduced into the polyamide.

For the formation of a photosensitive layer from the so obtained composition, a method in which the solvent is removed by distillation, the residue is dried and granulated and the resulting granule is compressed under heating to a support by using a press or the like to form a photosensitive layer on the support may be used. A method in which a sheet is prepared from the composition by a dry film-forming technique and the sheet is bonded to a support to form a photosensitive layer on the support may also be used. Furthermore, a photosensitive layer can be formed directly on a support by a dry film-forming technique. As the support, there can be sheets of metal, such as iron, stainless steel, aluminum and copper, sheets of synthetic resins, such as polyethylene terephthalate, and sheets of rubber, such as a styrene/butadiene rubber may be used. It is preferred that the photosensitive layer be formed at a thickness of 0.1 to 10 mm.

The relief image for the printing plate is formed by using the photosensitive composition of the present invention as follows. A negative film having a transparent image area is superposed close to the photosensitive layer, which has been formed as described above. The photosensitive composition is usually cured by irradiation with ultraviolet rays having a predominant wave length of approximately 300 to 400 milli-microns. Then, the portion corresponding to the non-image area is washed out by a liquid mixture of alcohol and water or water alone to form a relief image corresponding to the image area on the film.

When the photosensitive resin composition of the present invention is used, a soft and elastic relief image possessing good image-reproducing properties can be obtained even by short-time irradiation with ultraviolet rays. This result is achieved because by the reaction of the compound having epoxy and vinyl groups as component (B) with the terminals of the polyamide as the component (A), double bonds are introduced into the polyamide and the polyamide is a part of the structure formed by photo-polymerization of the polyfunctional vinyl monomer, component (C). Moreover, since component (C) is compatible with the polyamide, problems, such as separation of the polyfunctional vinyl monomer onto the plate surface, do not occur even after long-term storage.

The present invention will now be described in detail with reference to the following Examples. All "parts" in these Examples are by weight.

EXAMPLE 1

A three-neck flask was charged with 1 mole of ethylene glycol diglycidyl ether, 2 moles of methacrylic acid, 1% by weight of triethylbenzyl ammonium chloride and 0.1% by weight of hydroquinone monomethyl ether and the mixture was stirred at 80° C. under a current of a nitrogen gas. When the reaction had been conducted for 10 hours, the acid value dropped below 1, and the reaction was stopped at this point. From the results of an examination of the infrared absorption spectrum of the reaction product, it was confined that a bifunctional monomer having the following structure was formed:

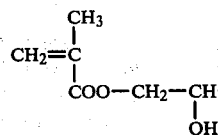 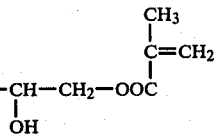

$$CH_2=\underset{\underset{COO-CH_2-CH-CH_2-O-CH_2-CH_2-O-CH_2-CH-CH_2-OOC}{|}}{\overset{CH_3}{\underset{|}{C}}} \qquad \underset{\underset{OH}{|}}{\overset{CH_3}{\underset{|}{C}}}=CH_2$$

100 parts of a polyamide (trade name "Toray Nylon CM-9,000", manufactured and supplied by Toray Industries) was dissolved under by heating at 100° C. for 3 hours in a mixed solvent comprising 160 parts ethanol and 40 parts of water. The temperature was lowered to 80° C., and 5 parts of glycidyl methacrylate was added to the solution and the mixture was stirred for 1 hour. Then, 85 parts of the bifunctional vinyl monomer obtained by the above-described addition reaction of ethylene glycol glycidyl ether and methacrylic acid, 2 parts of dimethylbenzylketal as a photo-sensitizer and 0.1 part of hydroquinone monomethyl ether as a thermal polymerization inhibitor were added to the polyamide solution and the mixture was stirred at 80° C. for 2 hours to obtain a solution.

This solution was cast on a polyester film having a thickness of 200 microns on which a polyurethane type adhesive had been precoated, to obtain a photosensitive layer after drying of 750 microns. The polyester film was then placed in an oven at 60° C. for 6 hours to completely evaporate the solvent. An ethanol/water solvent mixture having an ethanol/water weight ratio of 80/20 was thinly coated on the surface of the photosensitive layer of the substrate-supported sheet and the surface was covered with a polyester film having a thickness of 100 microns. Then, the covered sheet was stored in the dark for 10 days.

The cover film was peeled from the plate material, and a gray scale negative film for sensitometry (21-Steps Sensitivity Guide supplied by Stouffer Co.) and a negative film for evaluation of the image-reproducing properties (133 lines, 3%, 5% and 10% of dots, independent points of 200 microns and 300 microns and fine lines of 50 microns and 70 microns) were placed on the surface of the photosensitive layer, and the assembly was exposed for one minute and 30 seconds by Jet Printer Model 2,000 (supplied by Oak Seisakusho K. K.).

After exposure, the wash-out operation was carried out at a liquid temperature of 30° C. by using a wash-out liquid comprised of ethanol and water at a weight ratio of 80/20. When the wash-out operation had been conducted for 3 minutes, the non-image portion was completely dissolved out to produce a relief image.

In the gray scale portion, 16 steps remained, and it was confirmed that the sensitivity was very high. Furthermore, it was found that in the image area, even fine portions such as 3% dots, 200 micron independent points and 50 micron fine lines were reproduced with complete fidelity. The plate had a Shore hardness D of 55, and was very soft and elastic.

When a printing test was carried out using the plate, prints having a sharp image without thickening of image lines were obtained. Furthermore, no problem of separation of the plate from the drum was observed.

When this plate was subjected to an accelerated storage test under high humidity and high temperature conditions with a temperature of 40° C. and a relative humidity of 80% for 6 months, no separation of the polyfunctional vinyl monomer or the like onto the surface was observed, and it was confirmed that a high quality could be guaranteed for a long time.

When the plate was chemically analyzed, for the decrease in the amount of terminal groups of the polyamide it was found that about 3 parts of glycidyl methacrylate were bonded to the polyamide.

EXAMPLE 2

A three-neck flask was charged with 1 mole of propylene glycol diglycidy ether, 2 moles of acrylic acid, 1% by weight of triethylbenzyl ammonium chloride and 0.2% by weight of hydroquinone monomethyl ether, and the mixture was stirred at 80° C. to effect a reaction. When the reaction had been conducted for 8 hours, the acid value dropped below 1 and the reaction was stopped. From the results of an examination of the infrared absorption spectrum, it was confirmed that a bifunctional vinyl monomer having the following structure was formed:

When printing was carried out using this plate, it was found that the ink-adhering properties were very good and sharp prints were obtained.

EXAMPLE 3

A three-neck flask was charged with 1 mole of triethylene glycol, 2 moles of glycidyl methacrylate, 0.5% by weight of zinc borofluoride and 0.05% by weight of hydroquinone monomethyl ether, and a reaction was carried out at 50° C. while tracing by gas chromatography the amount of residual glycidyl methacrylate. When the reaction had been conducted for 10 hours, conversion reached about 80%. However, no substantial increase in conversion was observed after that point. After the reaction had been conducted for 12 hours, it was stopped. The reaction mixture liquid was washed three times with water to remove unreacted triethylene glycol and glycidyl methacrylate, and from the results of an examination of the infrared absorption spectrum of the residue, it was confirmed that a bifunctional vinyl monomer having the following structure was formed:

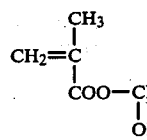
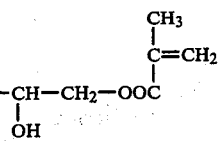

$$CH_2=C(CH_3)-COO-CH-CH_2-O-CH_2-CH_2-O-CH_2CH_2-OCH_2-CH_2-OCH_2-CH-CH_2-OOC-C(CH_3)=CH_2$$
$$\qquad\qquad\quad|\qquad\qquad\qquad\qquad\qquad\qquad\qquad\qquad\qquad\qquad\qquad\qquad\qquad|$$
$$\qquad\qquad\quad OH\qquad\qquad\qquad\qquad\qquad\qquad\qquad\qquad\qquad\qquad\qquad\qquad\qquad OH$$

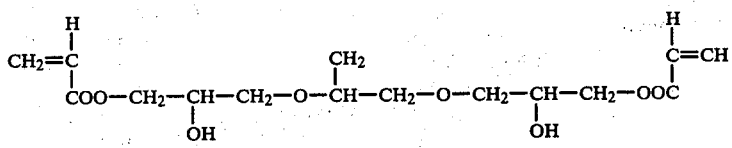

$$CH_2=CH-COO-CH_2-CH(OH)-CH_2-O-CH(CH_2)-CH_2-O-CH_2-CH(OH)-CH_2-OOC-CH=CH_2$$

A polyamide (an ε-caprolactam/adipic acid/hexamethylene diamine/polyethylene glycol diamine [weight ratio=30/35/15/20]copolymer nylon) was dissolved by heating in a solvent mixture of ethanol and water at a weight ratio of 70/30. Ten parts of glycidyl methacrylate were added to 100 parts of the polyamide, and the mixture was stirred at 80° C. for 30 minutes. Then, 50 parts of the above-mentioned bifunctional vinyl monomer, 30 parts of 2-hydroxy-3-phenoxypropyl acrylate, 5 parts of diethylene glycol, 5 parts of benzophenone and 10 parts of triethanolamine were added to the mixture, and the resulting mixture was stirred at 80° C. for 2 hours to obtain a solution. The solution was cast on a substrate, as described in Example 1, and dried to obtain a green plate.

The cover film was peeled from the green plate, and the same negative films as used in Example 1 were placed on the photosensitive layer and the assembly was exposed for 4 minutes using a chemical lamp exposure apparatus (lamp FL-20S-BL-360 supplied by Mitsubishi Denki K.K.). The exposed plate was subjected to a wash-out operation with water for 2 minutes in a brush type wash-out machine to obtain a relief image.

The gray scale sensitivity was 16 steps, and the 3% dots, the 200 micron independent points and the 50 micron fine lines were completely reproduced. The exposed plate had a Shore hardness A of 85 and a Shore hardness D of 35. Thus, it was confirmed that the exposed plate had excellent softness and elasticity.

An N-methoxymethyl-substituted nylon 6 (trade name "Toresin MF-30" supplied by Teikoku Kagaku Sangyo Inc.) was dissolved by heating in a solvent comprised of ethanol and water at a weight ratio of 90/10. Fifteen parts of N-glycidylacrylamide were added to 100 parts of the polyamide and the mixture was stirred at 80° C. for 1 hour. Then, 100 parts of the polyfunctional vinyl monomer prepared by the above-described addition reaction between triethylene glycol and glycidyl methacrylate, 10 parts of a tetrafunctional vinyl monomer obtained by reacting 1 mole of xylylene diamine with 4 moles of glycidyl methacrylate as a subsidiary photo-crosslinking agent, 2 parts of benzoin ethyl ether as photo-sensitizer and 0.05 parts of hydroquinone as a thermal polymerization inhibitor were added to the above mixture, and the resulting mixture was stirred at 80° C. for 3 hours. The solution was deaerated and in the same manner as described in Example 1, the photosensitive relief material was cast on a substrate having a thickness of 2 mm.

In the same manner as described in Example 1, a printing plate was prepared from this relief material. The gray scale sensitivity was 15 steps, and the 3% dots, the 200 microns independent points and the 50 microns fine lines were reproduced with complete fidelity. The plate had a Shore hardness D of 42.

EXAMPLE 4

A three-neck flask was charged with 1 mole of trimethylolpropane triglycidyl ether, 3 moles of acrylic acid and 0.5% by weight of hydroquinone monomethyl ether, and the mixture was maintained at 90° C. for 8 hours. From the results of the examination of the infrared absorption spectrum, it was confirmed that a trifunctional vinyl monomer having the following structure was formed:

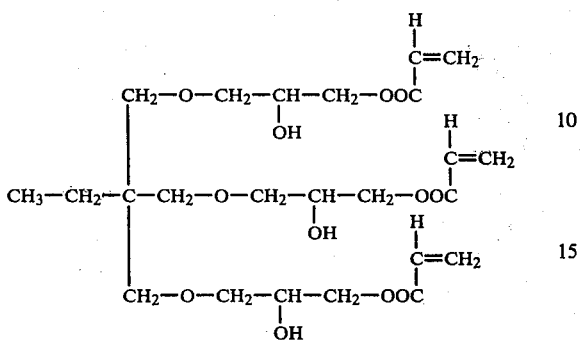

A polyamide (trade name "Ultramide 1C", manufactured and supplied by BASF) was dissolved by heating in a mixed solvent comprised of ethanol and water at a weight ratio of 80/20. Ten parts of glycidyl acrylate, 100 parts of the above-mentioned trifunctional vinyl monomer prepared from trimethylolpropane triglycidyl ether and acrylic acid, 2 parts of dimethylbenzylketal as a photo-sensitizer and 0.1% by weight of t-butylcatechol as a thermal polymerization inhibitor were simultaneously added to 100 parts of the polyamide in the solution described above, and the mixture was stirred at 80° C. for 3 hours. By chemical analysis of the solution, it was found that about 4 parts of glycidyl acrylate were reacted with the polyamide.

The solution was cast on an iron plate having a thickness of 0.1 mm, on which an epoxy resin adhesive had been precoated and the plate was maintained at 60° C. for 6 hours to remove the solvent and a photosensitive material having a thickness of 1.0 mm was obtained.

To obtain a relief image, the material was exposed for two minutes and 30 seconds using the same mercury lamp exposure apparatus as used in Example 1 and the wash-out operation was conducted for 6 minutes with a liquid developer comprised of ethanol and water at a weight ratio of 80/20 using a spray type wash-out machine. It was found that all of the image lines of the negative film were reproduced with complete fidelity in the relief. The plate had a Barcol hardness of 65. When the green plate was stored at a relative humidity of 80% and a temperature of 40° C. for 6 months, separation of the polyfunctional monomer onto the plate surface did not occur.

We claim:

1. A photosensitive polyamide resin composition comprising the following components:
   (A) 100 parts by weight of an alcohol-soluble polyamide,
   (B) 0.1 to 50 parts by weight of a compound having both vinyl and epoxy groups in the same molecule,
   (C) 10 to 200 parts by weight of a polyfunctional vinyl monomer having a molecular weight of lower than 2,000 which is prepared by the reaction of a polyfunctional glycidyl ether with acrylic acid or methacrylic acid, or by the reaction of a saturated polyhydric alcohol with glycidyl acrylate or glycidyl methacrylate, at least two unsaturated bonds in the polyfunctional vinyl monomer being represented by the formula:

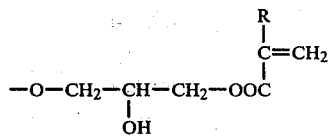

wherein R stands for H or CH$_3$, and
   (D) 5 to 100 parts by weight of a monofunctional vinyl monomer selected from the group consisting of β-hydroxyethyl-β-acryloyloxyethyl phthalate, β-hydroxethyl-β-methacryloyloxyethyl phthalate, 2-hydroxy-3-phenoxypropyl acrylate and 2-hydroxy-3-phenoxypropyl methacrylate.

2. The composition according to claim 1 wherein said compound having both vinyl and epoxy groups is selected from the group consisting of glycidyl acrylate, glycidyl methacrylate, N-glycidylacrylamide, glycidyl α-chloroacrylate and an unsaturated compound prepared by the reaction of a diepoxide compound with a vinyl group-containing carboxylic acid amine or alcohol.

3. The composition according to claim 1 or 2, wherein the amount of said compound having both vinyl and epoxy groups is in the range of from 1 to 20 parts by weight.

4. The composition according to claim 1, wherein said polyfunctional vinyl monomer is prepared by the reaction of a polyfunctional glycidyl ether with acrylic acid or methacrylic acid, or by the reaction of a saturated polyhydric alcohol with glycidyl acrylate or methacrylate.

5. The composition according to claim 1 or 4, wherein the amount of said polyfunctional vinyl monomer is in the range of from 20 to 150 parts by weight.

6. The composition according to claim 1, which further comprises up to 100 parts by weight, per 100 parts by weight of the polyamide component (A), of a polyfunctional vinyl monomer other than the polyfunctional vinyl monomer component (C).

7. The composition according to claim 1, which further comprises up to 100 parts by weight, per 100 parts by weight of the polyamide component (A), of an organic compound which is not polymerizable by irradiation with actinic rays and which is compatible with the polyamide component (A).

8. The composition according to claim 1, which further comprises 0.001 to 10% by weight of a photosensitizer based on the weight of the composition.

9. The composition according to claim 1, which further comprises 0.001 to 5% by weight of a polymerization inhibitor based on the weight of the composition.

* * * * *